United States Patent
Grundmann et al.

(10) Patent No.: US 11,402,672 B2
(45) Date of Patent: Aug. 2, 2022

(54) QUANTUM CONFINED NANOSTRUCTURES WITH IMPROVED HOMOGENEITY AND METHODS FOR MAKING THE SAME

(71) Applicant: X Development LLC, Mountain View, CA (US)

(72) Inventors: Michael Jason Grundmann, San Jose, CA (US); Martin Friedrich Schubert, Mountain View, CA (US)

(73) Assignee: X Development LLC, Mountain View, CA (US)

( * ) Notice: Subject to any disclaimer, the term of this patent is extended or adjusted under 35 U.S.C. 154(b) by 865 days.

(21) Appl. No.: 15/970,790

(22) Filed: May 3, 2018

(65) Prior Publication Data
US 2019/0339550 A1 Nov. 7, 2019

(51) Int. Cl.
*G02F 1/017* (2006.01)
*H01L 21/02* (2006.01)
*H01L 51/50* (2006.01)
*B82Y 20/00* (2011.01)

(52) U.S. Cl.
CPC ...... *G02F 1/01716* (2013.01); *G02F 1/01725* (2013.01); *H01L 21/02601* (2013.01); *H01L 51/502* (2013.01); *B82Y 20/00* (2013.01); *G02F 1/01791* (2021.01)

(58) Field of Classification Search
CPC .......... G02B 1/118; G02B 1/12; G02B 5/204; G02B 6/107; G02F 1/01716; G02F 1/01725
See application file for complete search history.

(56) References Cited

U.S. PATENT DOCUMENTS

| | | | |
|---|---|---|---|
| 4,806,321 | A | 2/1989 | Nishizawa et al. |
| 5,376,580 | A | 12/1994 | Kish et al. |
| 5,614,435 | A | 3/1997 | Petroff et al. |
| 6,344,084 | B1 | 2/2002 | Koinuma et al. |
| 6,596,377 | B1 | 7/2003 | Hersee et al. |

(Continued)

OTHER PUBLICATIONS

'spie.org' [online] "Generating Light with Control of Polarization Direction," Hsu et al., Apr. 7, 2014, [retrieved on May 9, 2018] Retrieved from Internet: URL<http://spie.org/newsroom/5412-generating-light-with-control-of-polarization-direction?SSO=1> 2 pages.

(Continued)

*Primary Examiner* — Christopher Stanford
*Assistant Examiner* — Journey F Sumlar
(74) *Attorney, Agent, or Firm* — Fish & Richardson P.C.

(57) ABSTRACT

A method that includes: providing a substrate including a layer of a crystalline material having a first surface; and exposing the first surface to an environment under conditions sufficient to cause epitaxial growth of a layer of a deposition material on the first surface, wherein exposing the first surface to the environment includes illuminating the substrate with light at a first wavelength while causing the epitaxial growth of the layer of the deposition material. The first surface includes one or more discrete growth sites at which an epitaxial growth rate of the quantum confined nanostructure material is larger than areas of the first surface away from the growth sites by an amount sufficient so that the deposition material forms a quantum confined nanostructure at each of the one or more discrete growth sites.

17 Claims, 7 Drawing Sheets

(56) References Cited

U.S. PATENT DOCUMENTS

| | | | |
|---|---|---|---|
| 7,498,182 B1* | 3/2009 | Sampath | H01L 33/007 438/21 |
| 2008/0142784 A1* | 6/2008 | Samuelson | C30B 25/00 257/14 |
| 2011/0216795 A1* | 9/2011 | Hsu | H01L 21/0254 438/31 |
| 2012/0248412 A1* | 10/2012 | Mitin | H01L 29/127 977/932 |
| 2014/0027710 A1* | 1/2014 | Liu | H01L 21/02458 257/14 |
| 2015/0053261 A1* | 2/2015 | Tsuchiya | H01L 31/035227 136/256 |
| 2019/0198562 A1* | 6/2019 | Schubert | H01L 27/156 |

OTHER PUBLICATIONS

Liu et al. "Energy band structure tailoring of vertically aligned InAs/GaAsSb Quantum Dot Structure for Intermediate-band Solar Cell Application by Thermal Annealing Process," Optics Express, vol. 22(25), Dec. 2014, 12 pages.

Ukhanov et al. "Orientation Dependence of the Optical Properties in InAs Quantum-dash Lasers on InP," Applied Physics Letters, 81, Aug. 2002, 3 pages.

Watanabe et al. "Growth Orientation Control of Metal Nanostructures Using Linearly Polarized Light Irradiation," Thin Solid Films, vol. 621, Jan. 1, 2017, pp. 137-144.

* cited by examiner

QUANTUM CONFINED NANOSTRUCTURES WITH IMPROVED HOMOGENEITY AND METHODS FOR MAKING THE SAME

TECHNICAL FIELD

This disclosure generally relates to quantum confined nanostructures, and apparatuses and methods of making the quantum confined nanostructures.

BACKGROUND

A quantum confined nanostructure is a nanostructure formed from a conducting or semiconducting material, such as compound semiconductors. A quantum dot is an example of a quantum confined nanostructure. A quantum dot typically ranges from 2 to 50 nm in dimension, a scale in which effects of quantum confinement of electrons or holes affects the overall characteristics of the nanostructure in significant ways. The effects of quantum confinement can be harnessed in various ways. For example, a quantum dot can be used to implement a qubit for quantum computing, such as a spin qubit or a charge qubit, by trapping a single electron within the quantum dot. As another example, an emission and absorption wavelength of the quantum dot can be modified from those of the bulk constituent material by changing the dimension of the quantum dot.

SUMMARY

This disclosure features methods for controlling various characteristics of quantum confined nanostructures, such as dimension, shape, and location.

Controlling the dimension, shape, location, or combination thereof of quantum confined nanostructures is important in various applications. For example, for multi-qubit quantum computing applications, it is desirable to have quantum dots with similar or identical dimensions and shapes to approximate a collection of "artificial atoms." As another example, differences in characteristics of quantum dots lead to inhomogeneous broadening of the absorption and emission spectra of the quantum dots, which can negatively affect performance of optical devices using quantum dots as a light emitter or absorber.

One way of controlling the size, shape, or location of the quantum confined nanostructures is through in-situ control of the growth of the quantum confined nanostructures, utilizing an illumination-controlled growth process. Absorption of light by the quantum confined nanostructures affects the balance between adsorption and desorption during the growth process. As a result, photoabsoprtion (i.e., absorption of illuminated light) can cause a decrease in growth rate, and in certain conditions, reduce the growth rate to an extent that practically stops, or clamps, the growth of the quantum confined nanostructure. As absorption wavelengths of the quantum confined nanostructures change with the size of the quantum confined nanostructures, growth causing an increase in the size of the quantum confined nanostructures causes a corresponding change in the absorption wavelength. Typically, as quantum-confined nanostructures grow in size, their absorption wavelength increases. Therefore, for a fixed illumination wavelength, the growth will slow down, or stop all together, once the size of the quantum confined nanostructures reaches a size corresponding to the illumination wavelength, enabling precise control over the absorption wavelength, and therefore the dimension, of the quantum confined nanostructures.

Further, the rate of adsorption and desorption may be different for different crystallographic planes of the semiconductor material being grown, which may lead to different growth rates along different crystallographic planes. As a result, by controlling a polarization of the illuminated light, shape of quantum confined nanostructures can be controlled. For example, quantum dash structures, which are analogous to quantum dots that are elongated along an axis, can be formed using polarization-controlled growth. Moreover, the polarization axis of linearly polarized illumination can be used to grow quantum dashes aligned to the polarization axis.

Quantum confined nanostructures are typically grown using metal-organic chemical vapor deposition (MOCVD) or molecular beam epitaxy (MBE) systems having a metallic vacuum chamber. When illumination is applied onto a substrate placed within the vacuum chamber for controlling the growth of quantum confined nanostructures, the light may be reflected by the substrate, which may in turn be reflected by the interior surfaces of the vacuum chamber and eventually be reflected back onto the substrate, adversely affecting the control over the growth process. As such, a substrate having a buried absorber layer engineered to absorb the unused light for growth control can be used to reduce reflection from the substrate. Furthermore, the interior surfaces of the vacuum chamber may be modified to further absorb reflected light and/or reduce specular reflection from the interior surface.

In general, in a first aspect, the disclosure features a method that includes: providing a substrate including a layer of a crystalline material having a first surface; and exposing the first surface to an environment under conditions sufficient to cause epitaxial growth of a layer of a deposition material on the first surface, wherein exposing the first surface to the environment includes illuminating the substrate with light at a first wavelength while causing the epitaxial growth of the layer of the deposition material. The first surface includes one or more discrete growth sites at which an epitaxial growth rate of the quantum confined nanostructure material is larger than areas of the first surface away from the growth sites by an amount sufficient so that the deposition material forms a quantum confined nanostructure at each of the one or more discrete growth sites.

Embodiments of the method can include one or more of the following features. For example, an epitaxial growth rate of the deposition material can decrease when the discrete quantum confined nanostructure exceeds a dimension corresponding to the first wavelength. The light at the first wavelength can be linearly polarized along a first direction. Exposing the first surface to the environment can further include illuminating the substrate with light at a second wavelength while causing the epitaxial growth of the layer of the deposition material. The light at the second wavelength can be linearly polarized along a second direction orthogonal to the first direction. The substrate can be exposed to the light at the first and second wavelengths simultaneously. The one or more quantum confined nanostructures can have an anisotropic shape having a long dimension and a short dimension orthogonal to the long dimension, the long and short dimensions corresponding to the first and second wavelengths, respectively.

In some embodiments, the one or more discrete growth sites can correspond to locations of increased strain in the crystalline material relative to strain in the crystalline material away from the growth sites. The substrate can include a second layer adjacent to the layer of the crystalline material, the crystalline layer being an epitaxial layer and second layer including portions having a first composition and portions having a second composition different from the first composition, the variation in composition of the second layer causing the locations of increased strain in the crystalline material.

In some embodiments, the substrate can include a layer that substantially absorbs light at the first wavelength.

In some embodiments, the environment can be provided by a deposition chamber in which the substrate is placed, an inner wall of the deposition chamber reflecting substantially no light at the first wavelength.

In some embodiments, the epitaxial growth can be performed using chemical vapor deposition. In some embodiments, the epitaxial growth can be performed using molecular beam epitaxy.

In some embodiments, the method can further include exposing the deposition material to an etchant to remove deposition material from the substrate. The method can further include exposing the deposition material to illumination at a third wavelength simultaneously to exposing the deposition material to the etchant. The light at the third wavelength can increase removal of the deposition material at growth site where the deposition material includes a defect relative to the deposition material at a growth site where the deposition material is free from defects. The defect can cause absorption of two more photons at the third wavelength by the deposition material.

In another aspect, the disclosure features an article that includes: a substrate including a layer of a crystalline material, the layer of the crystalline material including locations of increased strain in the crystalline material relative to strain in the crystalline material away from the locations; and a quantum confined nanostructure layer supported by the substrate and in contact with a surface of the layer of the crystalline material, the quantum confined nanostructure layer including one or more quantum confined nanostructures each including a layer of an epitaxial crystalline material, each of the one or more quantum confined nanostructures being located at a corresponding one of the locations of increased strain in the layer of the crystalline material. Each quantum confined nanostructure has a dimension corresponding to a first wavelength and the substrate includes a layer that substantially absorbs light at the first wavelength.

Embodiments of the article can include one or more of the following features. For example, the substrate can further include a second layer adjacent to the layer of the crystalline material, the crystalline layer being an epitaxial layer and second layer including portions having a first composition and portions having a second composition different from the first composition, the variation in composition of the second layer causing the locations of increased strain in the crystalline material.

In some embodiments, the quantum confined nanostructures can be quantum dots or quantum dashes.

In some embodiments, the quantum confined nanostructures can each have an anisotropic shape having a long dimension and a short dimension orthogonal to the long dimension. The long dimension of each quantum confined nanostructure can lie parallel to a common axis.

Among other advantages, quantum confined nanostructures with improved uniformity in size and shape can be grown. Quantum dashes with aligned orientations can be grown through polarization-controlled growth. Defective quantum dots can be selectively removed based on sub-bandgap absorption.

The details of one or more implementations of the subject matter of this disclosure are set forth in the accompanying drawings and the description below. Other features, aspects, and advantages of the subject matter will become apparent from the description, the drawings, and the claims.

BRIEF DESCRIPTION OF THE DRAWINGS

Like reference numbers and designations in the various drawings indicate like elements.

DETAILED DESCRIPTION

Figure 1A:
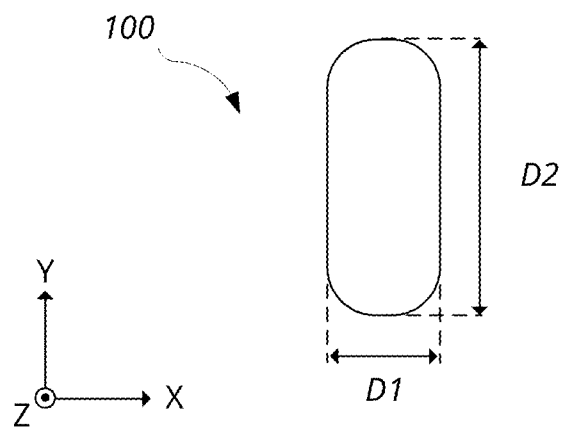
FIG. 1A shows a top view of an example quantum dash.

Referring to FIG. 1A, a top view of an example quantum dash 100 is shown. Cartesian axes are shown for ease of reference. The quantum dash 100 is an elongated structure with a first dimension D1 along the X-axis, and a second dimension D2 along the Y-axis. In the example shown, D1 is greater than D2.

The quantum dash 100 is a nanostructure that typically ranges from 2 nm to 50 nm in dimension along one or both of its axes, in which quantum confinement of electrons or holes affect the emission and absorption wavelength of the constituent material. Quantum dash is typically formed from a crystalline material. As such, the different sides or facets of the quantum dash 100 typically expose different crystallographic planes of the constituent crystalline material.

Figure 1B:
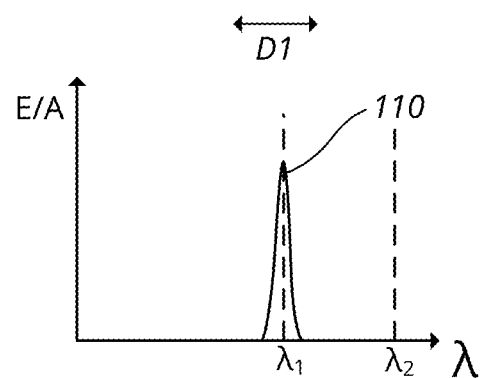
FIGS. 1B-1C show example emission/absorption spectra of a quantum dash along its principal axes.
Figure 1C:
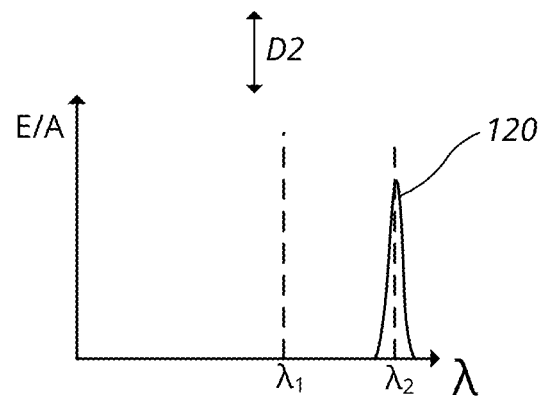

Referring to FIGS. 1B-1C, example emission/absorption spectra of a quantum dash along its principal axes are shown. The X-axes corresponds to wavelength A, and the Y-axes correspond to relative magnitude of emission (E) and absorption (A) by the quantum dash 100. The emission/absorption spectra of the quantum dash 100 typically have a Gaussian shape with an associated center wavelength and a full-width at half maximum (FWHM) linewidth. The dimensions of the quantum dash 100 and the center wavelengths of the emission and absorption spectra are generally correlated, where a reduction in the dimensions results in a decrease in the center wavelengths of the emission and absorption spectra, and vice versa.

The quantum dash 100 has a first emission/absorption spectrum 110 for light linear polarized along the X-axis and a second emission/absorption spectrum 120 for light linearly polarized along the Y-axis. In this example, the quantum dash 100 is elongated along the Y-axis relative to the X-axis. As such, electrons or holes of the quantum dash 100 experience less quantum confinement along the Y-axis relative to the X-axis. As a result, the second emission/absorption spectrum 120 is centered on a second wavelength $\lambda 2$ that is longer than a first wavelength $\lambda 1$, and the first spectrum 110 is centered on the first wavelength $\lambda 1$. This separation in emission/absorption spectra for light polarized along different axes of the quantum dash 100 can be used to control various characteristics of the quantum dash 100, such as its shape and orientation.

While a quantum dash 100 with two principal axes along the X- and Y-axes has been described, in general, quantum confined nanostructures may have three or more axes, and have three or more different types of crystallographic planes exposed along the facets. Such multi-axes quantum confined nanostructures may have respective emission/absorption spectra for each of the axes.

Figure 2A:
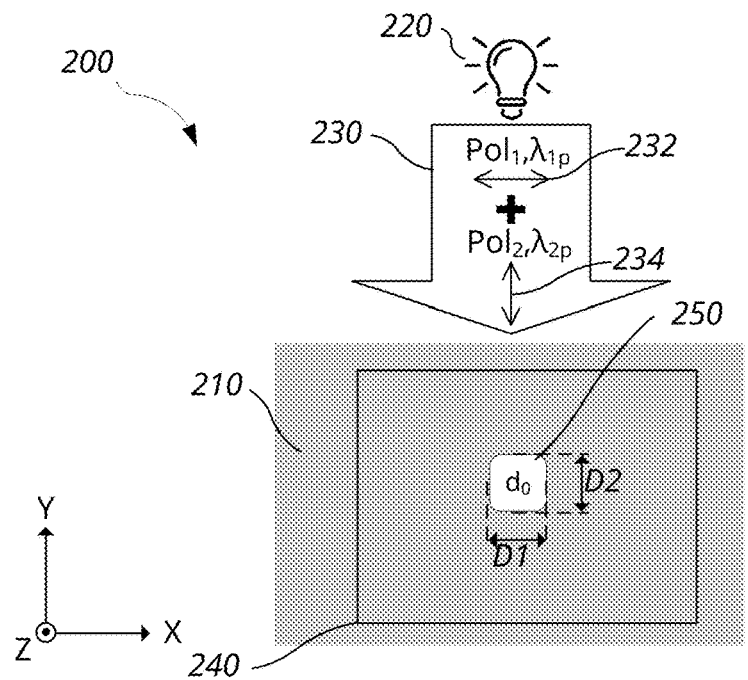
FIG. 2A shows an example of a quantum confined nanostructure (QCN) growth system for controlling growth of QCN through illumination.

Referring to FIG. 2A, an example of a quantum confined nanostructure (QCN) growth system 200 for controlling growth of QCN through illumination is shown. The QCN growth system 200 includes a quantum confined nanostructure forming environment 210 and an illumination source 220. A substrate 240 having a quantum confined nanostructure 250 is immersed in the quantum confined nanostructure forming environment 210. The illumination source 220 emits light 230 that illuminates the quantum confined nanostructure 250. The light 230 is incident on the substrate 240 along the Z-axis for the purpose of this illustration. The light 230 interacts with the quantum confined nanostructure 250 during the growth process to control the characteristics of the resulting nanostructure 250.

The light 230 has a first component 232 and a second component 234. The first component 232 has a first polarization Pol1 and a first illumination wavelength $\lambda 1p$. The second component 234 has a second polarization Pol2 and a second illumination wavelength $\lambda 2p$. A polarization of light is a property of light that corresponds to a direction of oscillation of an electromagnetic wave that constitutes the light. The electric field of the light may oscillate along an axis perpendicular to the propagation direction of the light, and such light may be referred to as linearly polarized light.

In this example, the first component 232 of the light 230 is a linearly polarized light with its electric field oscillating along the horizontal arrow shown (e.g., along the X-axis), and the second component 234 of the light 230 is a linearly polarized light with its electric field oscillating along the vertical arrow shown (e.g., along the Y-axis). As such, the first component 232 and the second component 234 may interact with the quantum confined nanostructure 250 in a distinct manner, affecting the growth of the nanostructure 250. Furthermore, in this example, the first and second components 232 and 234 have a well-defined (e.g., narrow linewidth) illumination wavelengths of $\lambda 1p$ and $\lambda 2p$. For example, the linewidth of the first and second components may be on the order of 0.1 nm or less (e.g., 0.5 nm or less, 1 nm or less, or 5 nm or less).

The illumination source 220 may be, for example, a fixed-wavelength laser source, a tunable laser source, or a pulsed laser source. The narrow linewidth (e.g., 0.1 nm, 1 nm) of the light generated by such a laser source may be advantageous in achieving a tight distribution in dimensions of the illumination-controlled growth of the quantum confined nanostructure 250. In some implementations, the first and second components 232 and 234 of the light 230 may be generated, for example, by two different illumination sources, and combined using a beam combiner. For example, a free-space beam splitter cube may be used. As another example, a fiber light combiner (e.g., multiplexer) formed from polarization-maintaining fibers may be used to combine the two components into the light 230.

The quantum confined nanostructure forming environment 210 deposits quantum confined nanostructures 250 onto the substrate 240. The quantum confined nanostructure 250 is typically formed from material capable of emitting light, such as semiconductors having a direct bandgap. Such semiconductor materials typically require a high degree of crystallinity to function as an effective light emitting material. To attain the required degree of crystallinity, various specialized deposition techniques may be used, such as epitaxial growth. Examples of epitaxial growth techniques include metal-organic chemical vapor deposition (MOCVD), molecular beam epitaxy (MBE), and liquid phase epitaxy (LPE).

The forming environment 210 is generally a gaseous or liquid environment containing the various chemical precursors and/or constituent materials used in forming the quantum confined nanostructures 250, and may vary based on the employed deposition technique. For example, when depositing the quantum confined nanostructure 250 through MBE, the forming environment 210 can be a mixture of physical vapor of the constituent material of the quantum confined nanostructures, such as indium, gallium, and nitrogen when depositing an InGaN quantum confined nanostructure. As another example, when depositing the quantum confined nanostructure 250 through MOCVD, the forming environment 210 can be a mixture of various chemical precursors, such as tri-methyl-indium (TMI), tri-methyl-gallium (TMG), ammonia, and nitrogen when depositing an InGaN quantum confined nanostructure. As yet another example, when depositing the quantum confined nanostructure 250 through LPE, the forming environment 210 can be molten liquid of the constituent material of the quantum confined nanostructures, such as liquid-phase gallium nitride for depositing a GaN quantum confined nanostructure.

Forming quantum confined nanostructures typically requires a base layer with lattice parameters suitable for the material being deposited, such that the quantum confined nanostructure material and the base layer are lattice-matched. For example, the substrate 240 can be a sapphire substrate, which is formed of crystalline aluminum oxide. While the sapphire substrate is crystalline, its lattice constant is not equal to, for example, InGaN being deposited to form the quantum confined nanostructure. As direct deposition of the InGaN material on the sapphire substrate 240 leads to crystalline defects and consequently poor light emitting performance by the deposited InGaN quantum confined nanostructures 250, the base layer can serve as a buffer layer that serves to smooth the lattice mismatch between the substrate 240 and the quantum confined nanostructures 250. The base layer can also include a charge injection or extraction layer that can facilitate injection or extraction of electrons or holes into the quantum confined nanostructures 250 formed above to generate light or collect photocurrent.

In general, different light-emitting materials have various ranges of wavelengths over which they can emit light. As such, different light-emitting materials for forming the quantum confined nanostructures 250 can be chosen based on a desired emission wavelength. Examples of various semiconductors capable of emitting light include Gallium Arsenide (GaAs), Aluminum Gallium Arsenide (AlGaAs), Gallium Arsenide Phosphide (GaAsP), Aluminum Gallium Indium Phosphide (AlGaInP), Gallium(III) Phosphide (GaP), Gallium Arsenide Phosphide (GaAsP), Aluminum Gallium Phosphide (AlGaP), Indium Gallium Nitride (InGaN), Gallium(III) Nitride (GaN), Zinc Selenide (ZnSe), Boron Nitride (BN), Aluminum Nitride (AlN), Aluminum Gallium Nitride (AlGaN), and Aluminum Gallium Indium Nitride (AlGaInN).

Suitable material for the substrate 240 can be chosen based on the material of the quantum confined nanostructures 250. Examples of the material for the substrate include sapphire, silicon, silicon carbide, and various compound semiconductors such as AlN, GaN, GaAs, and InP. In cases where the lattice constants of the substrate and the quantum confined nanostructure material are sufficiently similar, the base layer can be omitted.

When the substrate 240 is exposed to the forming environment 210, the quantum confined nanostructures 250 may start forming spontaneously. For example, by controlling the deposition condition during the formation of the quantum confined nanostructures, quantum confined nanostructure 250 may be formed through various mechanisms such as self-assembly or nucleation as a direct product of the deposition process. In some implementations, the formation of the quantum confined nanostructures 250 may be guided by growth sites located on the substrate 240. Such growth sites may, among others, promote nucleation, and cause an epitaxial growth rate of the quantum confined nanostructure material to be sufficiently larger than areas of the substrate 240 away from the growth sites. The growth sites will be further described in relation to FIGS. 5A and 5B.

During an initial phase of the growth of the nanostructure 250, the quantum confined nanostructures 250 has a uniform dimension of do for both D1 along the X-axis and D2 along the Y-axis. Such symmetric quantum confined nanostructure 250 may be referred to as a quantum dot.

Figure 2B:
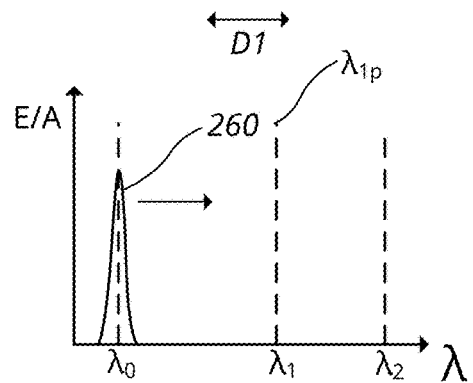
FIGS. 2B-2C show example emission/absorption spectra of a quantum confined nanostructure along its two axes.
Figure 2C:
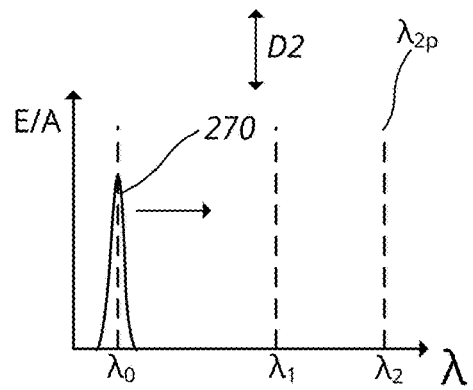

Referring to FIGS. 2B-2C, example emission/absorption spectra of a quantum confined nanostructure along two axes are shown. The quantum confined nanostructure 250 has a first emission/absorption spectrum 260 for light linearly polarized along the X-axis and a second emission/absorption spectrum 270 for light linearly polarized along the Y-axis. The first illumination wavelength $\lambda 1p$ and the second illumination wavelength $\lambda 2p$ of the light 230 are plotted along with the spectra 260 and 270 for reference.

At this point in the growth process, the quantum confined nanostructure 250 is symmetric with dimension do along both the X- and Y-axes. As such, the two spectra 260 and 270 are centered on an initial wavelength $\lambda 0$ that corresponds to a peak of the emission/absorption spectra of a quantum dot of size $d_0$. The correspondence between the size of the quantum dot or a quantum confined nanostructure and the peak wavelength vary based on various parameters of the nanostructures, such as the exact shape of the nanostructure (e.g., spherical, hemispherical, pyramidal, cubic) and its constituent material. Such correspondence may be determined, for example, by solving the effective mass Hamiltonian in the k dot p perturbation theory.

The absorption peaks of the spectra 260 and 270 are shorter than both the first illumination wavelength $\lambda 1p$ and the second illumination wavelength $\lambda 2p$. As such, the quantum confined nanostructure 250 does not absorb the illuminated light 230, and the nanostructure 250 continues to grow unaffected by the illumination of the light 230, as indicated by the arrow pointing to the right.

Figure 2D:
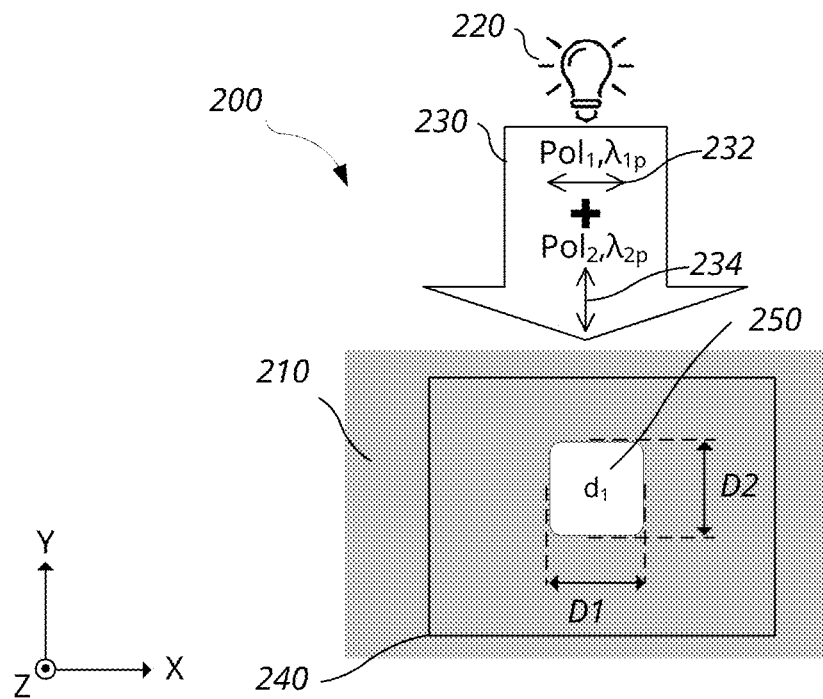
FIGS. 2D-2F show an example quantum confined nanostructure and example emission/absorption spectra of the quantum confined nanostructure along its two axes.
Figure 2E:
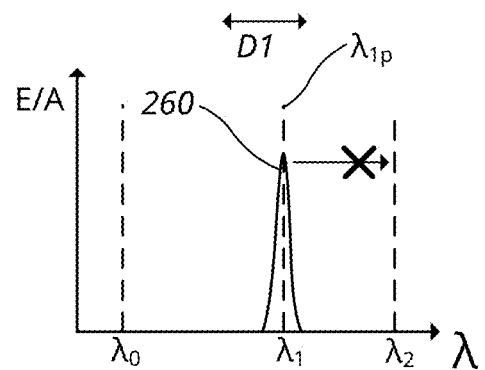
Figure 2F:
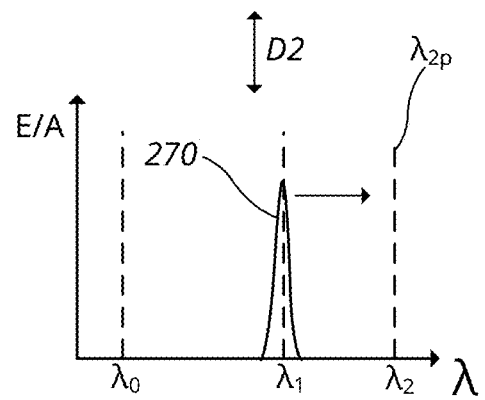

Referring to FIGS. 2D-2F, an example quantum confined nanostructure 250 and example emission/absorption spectra 260 and 270 of the quantum confined nanostructure 250 for light linearly polarized along its two axes are shown. At this point in the growth process, the quantum confined nanostructure 250 remains symmetric with dimension $d_1$ along both the X- and Y-axes. Dimension $d_1$ is greater than $d_0$ due to growth of the nanostructure 250. As such, the two spectra 260 and 270 are now centered on a first wavelength $\lambda 1$ that corresponds to a peak of the emission/absorption spectra of a quantum dot of size $d_1$.

As the nanostructure 250 grows from size $d_0$ to size $d_1$, the first absorption spectrum 260 begins to overlap with the first illumination wavelength $\lambda 1p$ of the first component 232 of the light 230. At this point, the first component 232 having linear polarization aligned along the X-axis begins to be absorbed in increasing amounts, generating an increasing number of electron-hole pairs. This generation of photo-generated carriers affects further growth of the quantum confined nanostructure 250.

In general, deposition, or growth, of a layer of material on a surface is governed at least in part by a balance of adsorption and desorption. Adsorption is the adhesion of atoms, ions, or molecules from gas, liquid, or dissolved solid onto a surface. Desorption is the reverse phenomenon of adsorption, resulting in a release of the atoms, ions or molecules from the surface. At a given moment, a surface can simultaneously experience both adsorption and desorption, where material is deposited when the rate of adsorption is greater than the rate of desorption, and removed when the relationship is reversed.

In case of the growth of the quantum confined nanostructure 250, the presence of photo-generated carriers can affect the balance between adsorption and desorption. When the quantum confined nanostructure 250 absorbs illuminated light and electron-hole pairs are generated as a result, the presence of the electrons and holes can decrease the adsorption rate, increase the desorption rate, or combination thereof, leading to a decrease in growth rate or a complete stop in further growth when the rate of adsorption is matched by the rate of desorption. For example, in case of MOCVD, the combination of electron and holes at the surface can modify the rates of various chemical reactions by the chemical precursors that take place at the surface of the quantum confined nanostructures. As the reaction products of the chemical precursors are adsorbed by the surface in forming the nanostructure, changing the rates of chemical reactions of the MOCVD process can lead to a change in the growth rate of the quantum confined nanostructure 250.

For example, without wishing to be bound by theory, a quantum dot may have growth rates that vary along its different crystallographic axes. The photon energy at which a light of particular polarization is absorbed by the quantum dot may be determined by the physical size of the quantum dot along the corresponding axis. As such, in case where the absorption of light leads to termination of growth, by illuminating with light at a particular wavelength and a particular polarization, the dimension of the dot along the associated axis may be determined by the illumination wavelength. In contrast, when the quantum dot is illuminated an unpolarized light, the growth may be terminated when any dimensions of the quantum dot reaches the threshold size, rather than when the dimension along a target axis reaches the threshold size.

Alternatively, in cases where the absorption of light induces or accelerates growth, a polarized light with a spectrum in which the intensity increases from a shorter wavelength toward the longer wavelength can be used to illuminate the quantum dot. Such illumination may cause the quantum dots to elongate along the polarization axis of the illumination.

Further, without wishing to be bound by theory, the electron-hole pairs generated by absorption of the linearly polarized light may initially be and/or continued to be localized on the facets that define the quantum confined nanostructure in the polarization direction. For example, in case of the first component 232, which is linearly polarized along the X-axis, the generated electron-hole pairs may be localized along the vertical facets (e.g., facets parallel to the Y-axis). Such localization may lead to selective modification of the adsorption-desorption balance along the vertical facets of the quantum confined nanostructure 250 while not affecting the balance at the horizontal facets.

In this example, the balance between the rate of adsorption and the rate of desorption reaches an equilibrium on the vertical facets when the center of the absorption spectrum 260 coincides with the first illumination wavelength $\lambda 1p$. As a result, the quantum confined nanostructure 250 stops growing along the X-axis at this point and does not grow any further, as indicated by the crossed out arrow. In contrast, the absorption spectrum 270 along the Y-axis does not overlap with the corresponding second component 234 of the light 230 having the second illumination wavelength $\lambda 2p$ longer than the first illumination wavelength $\lambda 1p$. As such, the quantum confined nanostructure 250 continues to grow along the Y-axis, as indicated by the arrow pointing toward the longer wavelengths.

Figure 2G:
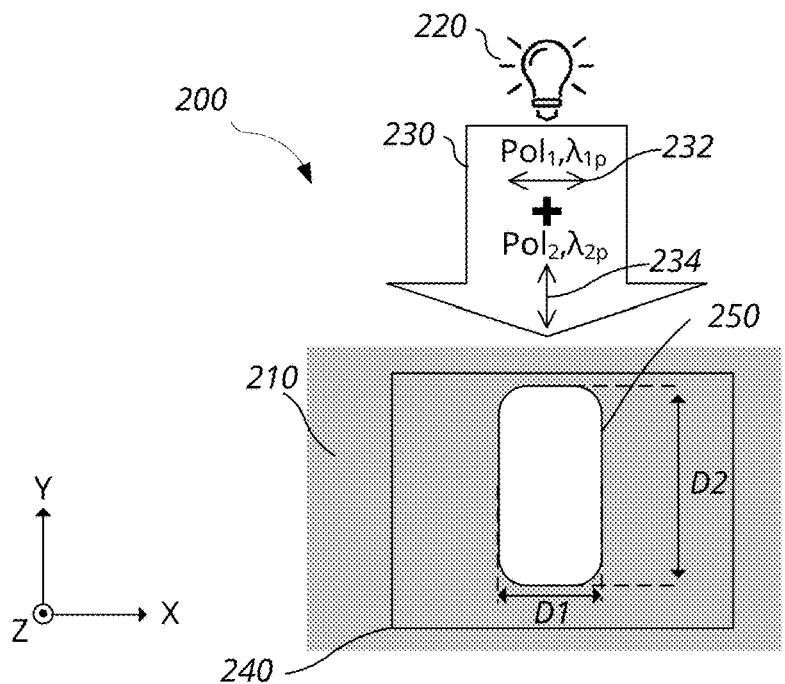
FIGS. 2G-2I show an example quantum confined nanostructure and example emission/absorption spectra of the quantum confined nanostructure along its two axes.
Figure 2H:
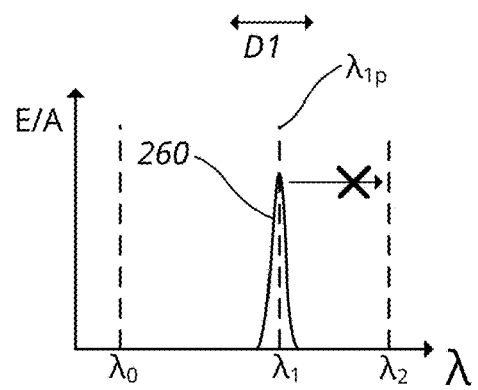
Figure 2I:
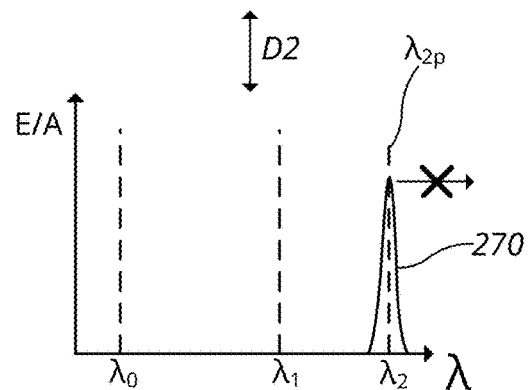

Referring to FIGS. 2G-2I, an example quantum confined nanostructure and example emission/absorption spectra of the quantum confined nanostructure for light linearly polarized along its two axes are shown. At this point in the growth process, the symmetric quantum confined nanostructure 250 of FIG. 2D has grown into an asymmetric quantum confined nanostructure having a dimension D1 along the X-axis and dimension D2 along the Y-axis. Such asymmetric structure may be referred to as a quantum dash.

Due to the absorption of the first component 232 of the light 230 by the quantum confined nanostructure 250, the nanostructure 250 did not grow further along the X-axis, remaining at dimension $d_2$. On the other hand, the growth along the Y-axis has continued, which shifted the second absorption spectrum 270 toward the second illumination wavelength $\lambda 2p$. In this example, the balance between the rate of adsorption and the rate of desorption reaches an equilibrium on the horizontal facets (e.g., facets parallel to the x-axis) when the center of the absorption spectrum 270 coincides with the second illumination wavelength $\lambda 2p$. As a result, the quantum confined nanostructure 250 stops growing along the Y-axis at this point and does not grow any further, terminating the growth of the quantum confined nanostructure 250.

At this point, the quantum confined nanostructure 250 has two well-defined axes, a first axis aligned along the Y-axis (a long axis), and a second axis aligned along the X-axis (a short axis). The short axis has a short dimension D1 that is determined at least in part by the first component 232 of the light 230, and the direction of the short axis corresponds to (e.g., is aligned with) the first linear polarization Pol1 of the first component 232. The short dimension D1, as previously described, is controlled at least in part by the first illumination wavelength $\lambda 1p$. The long axis has a long dimension D2 that is determined at least in part by the second component 234 of the light 230, and the direction of the long axis corresponds to (e.g., is aligned with) the second linear polarization Pol2 of the second component 234. The long dimension D2, as previously described, is controlled at least in part by the second illumination wavelength $\lambda 2p$.

The alignment of the short and long axes relative to the substrate 240 may be controlled by rotating the first and second linear polarizations Pol1 and Pol2 of the first and second components 232 and 234 of the light 230 with respect to the substrate 240. For example, the first and second linear polarizations may be rotated 45 degrees in a clockwise or counterclockwise direction, and such rotation may lead to a corresponding rotation of the quantum confined nanostructure 250 by 45 degrees. In general, the substrate 240 may have multiple quantum confined nanostructures 250 formed at multiple growth sites. By exposing the multiple quantum confined nanostructures 250 with the light 230 during their growth process, those nanostructures may be formed to have substantially similar dimensions (e.g., within 1%, 2%, 5%, 7% or 20% of average) and similar orientations (e.g., within 1 degree, 2 degrees, 5 degrees, or 10 degrees of average), thereby improving uniformity of the nanostructures 250.

It is believed that in some cases, the angular alignment between the substrate 240 and the axes of the quantum confined nanostructure 250 may be limited to certain discrete values. In general, a surface of the substrate 240 formed from a crystalline semiconductor material exposes a well-defined crystallographic plane with an associated crystal axis. In such cases, aligning the polarization axes of the first and second components 232 and 234 of the light 230 to the crystal axes of the surface of the substrate 240 may lead to improvements in the resulting quantum confined nanostructures 250 relative to those that are not aligned to the crystalline axes. Examples of the improvements include reduced defect density, and atomically smooth sidewalls or facets of the nanostructure.

A control over the size and shape of the quantum confined nanostructure 250 may improve the uniformity of quantum, optical, or electrical characteristics of the resulting nanostructures. For quantum computing, it is desirable for each of the qubits of the quantum computer to be indistinguishable, which typically improves quantum coherence of the quantum state held by the qubits, thereby improving the performance of the quantum computer. Atoms of natural elements satisfy this criteria, but man-made quantum confined nanostructures include many such atoms and typically suffer from non-uniformity. One common source of non-uniformity is the variations in the size of the quantum confined nanostructure. For example, quantum dots formed using self-assembly or nucleation processes typically have a distribution in their size that leads to inhomogeneous broadening of the overall emission spectrum of the quantum dots. Such non-uniformity in size may be improved using illumination controlled etching and growth techniques described in U.S. application Ser. No. 15/851,583 and U.S. application Ser. No. 15/851,602 titled "Multi-color monolithic light-emitting diodes and methods for making the same," which are incorporated by reference herein in their entirety. However, quantum confined nanostructures may emit and absorb at substantially the same wavelength (e.g., within 1 nm, within 0.1 nm, within 0.01 nm) but still be non-uniform, for example, in the polarization of the emitted light. Polarization of the emitted light may vary, for example, based on the shape and orientation of the quantum confined nanostructure. Non-uniformity in emission polarization may be detrimental to qubit operation.

Non-uniformity in the orientations of the quantum confined nanostructures may also reduce the operation efficiency of a laser with a gain medium based on quantum confined nanostructures. For example, when a gain medium includes asymmetric quantum dashes that are randomly oriented with respect to the target polarization of the laser, a portion of the quantum dashes may be unable to contribute to lasing in the target polarization due to a misalignment between the orientation of the quantum dashes and the polarization of the intra-cavity light. As such, control over shape and orientation of the quantum confined nanostructure using the disclosed techniques may improve qubit and laser performance.

While the first and second component 232 and 234 of the light 230 having orthogonal polarization axes have been illustrated in relation to FIGS. 2A-2I, in general, the two polarization axes may form any angle between 0 and 360 degrees. Furthermore, while light 230 having two components 232 and 234 has been described, in general, the light 230 may have 3 or more components with respective illumination wavelengths and polarization axes. Such light 230 may be used to improve control over the growth of the quantum confined nanostructure 250. For example, a quantum confined nanostructure having more than 4 facets or sidewalls, such as a hexagonal or octagonal nanostructure, may be formed using such a light.

While an asymptotic case where illumination-controlled growth of the quantum confined nanostructures 250 self-terminates has been described, in general, the illumination-controlled growth process can have a first growth rate while the quantum confined nanostructures have a dimension less than a threshold dimension, and at a second growth rate when the quantum confined nanostructures have a dimension at or greater than the threshold dimension. For example, the threshold dimension can be the dimension of the quantum confined nanostructures 250 at which the center of the emission spectrum of the quantum confined nanostructures 250 is located at a target emission wavelength for a given axis. By setting the illumination wavelength (e.g., $\lambda 1p$, $\lambda 2p$) to be at a certain offset $\Delta\lambda$ from the target emission wavelength, the absorption of the illuminated light by quantum confined nanostructures 250 can be increased to a sufficient level when the quantum confined nanostructures 250 reach the threshold dimension. At this point, depending on the criteria used in setting the offset $\Delta\lambda$, the growth rate of the quantum confined nanostructures 250 is reduced to the second growth rate that is lower than the first growth rate when the quantum confined nanostructures have a dimension less than the threshold dimension. For example, the second growth rate can be 5 nm/min or less, 4 nm/min or less, 2 nm/min or less, 1 nm/min or less, 0.5 nm/min or less, such as about 0.1 nm/min. As another example, the second growth rate can be 6 monolayers/min or less, 5 monolayers/min or less, 4 monolayers/min or less, 3 monolayers/min or less, 2 monolayers/min or less, such as about 1 monolayers/min.

In general, the first growth rate and the second growth rate are not fixed rates, but can be ranges of growth rates. As the growth rate of the illumination-controlled growth process is affected by the amount of photo-generated carriers, which are in turn related to the amount of absorbed light, the growth rates can change as the dimensions of the quantum confined nanostructures 250 change during the illumination-controlled growth process. As such, the first growth rate can have a range of growth rates that does not overlap with a range of growth rates for the second growth rate.

In some implementations, the light 230 may be laser pulses. Pulsed light 230 has a higher peak optical power relative to a continuous-wave (CW) light 230 with the same average optical power. Higher peak optical power may lead to a higher peak carrier concentration in the quantum confined nanostructure 250, which may improve the performance of the illumination controlled growth process through various nonlinear mechanisms. For example, the carrier concentration may have a nonlinear dependence on the peak optical power.

So far, use of illumination to control the growth and the characteristics of the quantum confined nanostructures have been described. Among multiple quantum confined nanostructures grown using various growth processes, certain nanostructures may contain defects that modify the characteristics of those nanostructures and adversely affect the performance of those nanostructures. As such, defects in the quantum confined nanostructures may degrade the uniformity in the characteristics of the nanostructures, and methods for selectively removing quantum confined nanostructures containing defects ("defective quantum confined nanostructures") will now be described.

Figure 3A:
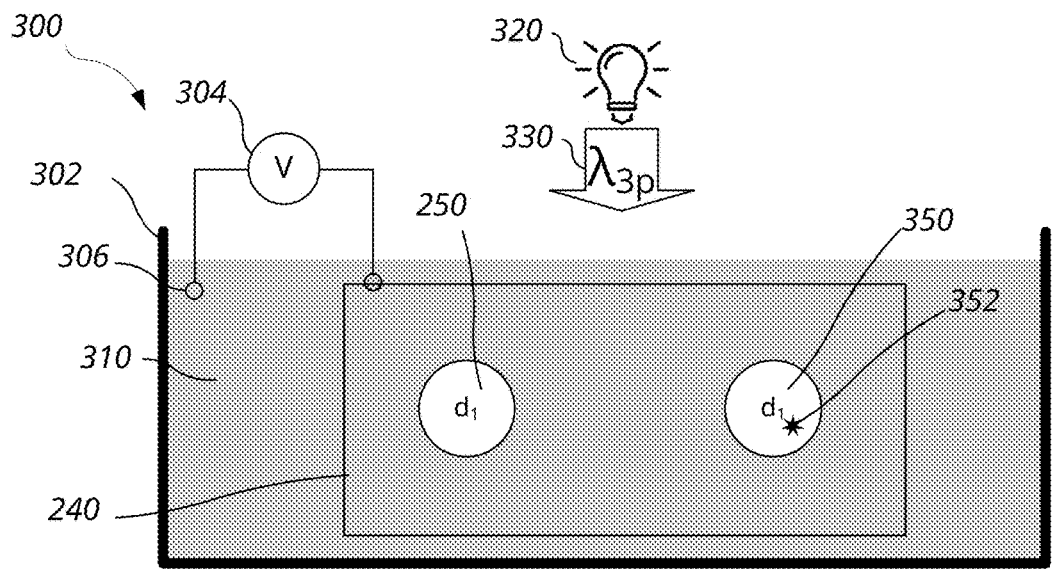
FIG. 3A shows an example of a quantum confined nanostructure etching system for selectively etching defective QCN through illumination.

Referring to FIG. 3A, an example of a quantum confined nanostructure (QCN) etching system 300 for selectively etching defective QCN through illumination is shown. The QCN etching system 300 includes an etchant tank 302, a voltage source 304, and an illumination source 320. The tank 302 is filled with liquid etchant 310. The substrate 240 includes the quantum confined nanostructure 250 and a defective quantum confined nanostructure 350. The substrate 240 is immersed in the liquid etchant 310. The voltage source 304 is electrically coupled with a counter electrode 306 and the quantum confined nanostructure 250 and 350 through the substrate 240, and applies a voltage across the etchant 310 and the quantum confined nanostructures 250 and 350. The illumination source 320 illuminates the quantum confined nanostructures 250 and 350 by emitting light 330 having a third illumination wavelength $\lambda 3p$. The light 330 interacts with the quantum confined nanostructures 250 and 350 during the etching process to selectively remove the defective quantum confined nanostructure 350 while not etching the nanostructure 250 without defect.

An ideal quantum confined nanostructure 250 may be formed from a perfectly crystalline material without any crystallographic defects, such as point defects (e.g., vacancies), line defects (e.g., dislocations), and planar defects (e.g., crystalline grain boundaries), and be free of impurity contamination (e.g., metallic impurities). The defective quantum confined nanostructure 350 is similar to the quantum confined nanostructure 250, but differs in that the nanostructure 350 contains one or more defects 352, which may be caused by, for example, the crystallographic defects or impurity contamination.

Figure 3B:
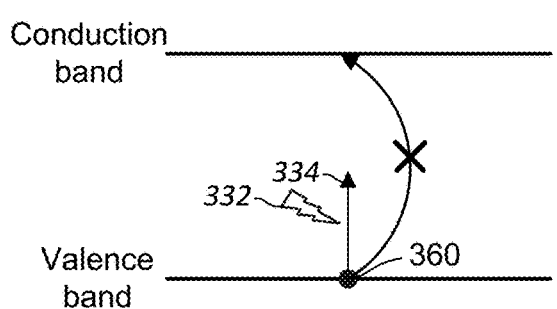
FIGS. 3B-3C show band diagrams of example quantum confined nanostructures.
Figure 3C:
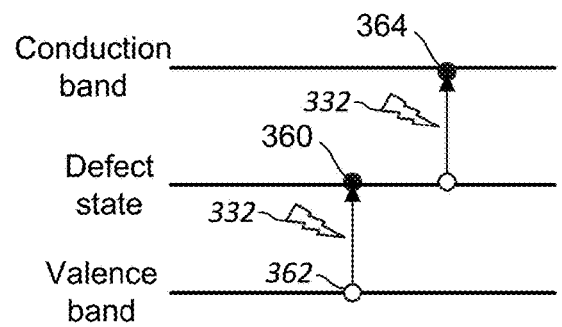

Referring to FIGS. 3B and 3C, band diagrams of the quantum confined nanostructures 250 and 350, respectively, are shown. The band diagrams illustrate the relative energy levels of the valence bands and the conduction bands of the quantum confined nanostructures 250 and 350. Referring first to FIG. 3B, an electron 360 initially resides in the valence band of the quantum confined nanostructure 250. The light 330 illuminates the nanostructure 250, and a photon 332 of the light 330 is shown in the band diagram to illustrate the illumination. The photon 332 has an energy that corresponds to its wavelength $\lambda 3p$, and the energy of the photon 332 is less than the vertical separation between the conduction band and the valence band (i.e., the bandgap). As such, the electron 360 is unable to absorb the photon 332, and fails to move from the valence band to the conduction band as illustrated by the crossed out arrow.

Now referring to FIG. 3C, the presence of the defect 352 modifies the band diagram of the defective quantum confined nanostructure from that of the non-defective quantum confined nanostructure 250. Specifically, the defect 352 leads to formation of a defect state with an energy level between the conduction band and the valence band. In this example, the defect state has an energy level that is approximately halfway between the energy level of the conduction and valence bands of the nanostructure 350. Now, due to the presence of the defect state, the electron 360 is able to absorb the photon 332 and first rise from the valence band to the defect state, leaving behind a free hole 362. Once the electron 360 is at the defect state, the electron 360 is able to once again absorb the photon 332 and rise to the conduction band, becoming a free electron 364. The free electron 364 and the free hole 362 may interact with the etchant 310 in various ways to selectively etch the defective quantum confined nanostructure 350.

Now referring back to FIG. 3A, in certain types of etching processes, etching of a material is affected by a presence of free charge carriers, such as the free electron 364 in the conduction band and free holes 362 in the valence band of the material being etched. For example, photoelectrochemical (PEC) etching is a type of chemical etching of semiconductor materials assisted by illumination of the semiconductor being etched. A chemical etching process proceeds by sustaining a chemical reaction between the semiconductor and the liquid etchant 310. Examples of various chemical reactions between the semiconductor and the etchant 310 includes oxidation and reduction of the semiconductor.

Oxidation reactions can be initiated by holes in the valence band of the semiconductor, and reduction reactions can be initiated by electrons in the conduction band of the semiconductor. In PEC etching, the electrons and/or holes necessary to drive the chemical reaction processes can be provided by illuminating the semiconductor with light having photon energies greater than the bandgap of the semiconductor. The illuminated light is absorbed by the semiconductor, generating electron-hole pairs that can drive the chemical reactions to sustain etching.

The resulting chemical reaction forms a reaction product which may or may not be soluble in the etchant 310. The chemical etching can be sustained when the reaction product is soluble in the etchant 310, which dissolves the reaction product and continues the chemical reaction with newly exposed semiconductor beneath the now-dissolved layer of the reaction product. In cases where the initial reaction product is not soluble in the etchant 310, subsequent chemical reactions may be necessary to convert the non-soluble reaction product to a soluble reaction product. Such subsequent chemical reactions may be driven by the electron-hole pairs generated by photo-absorption of the illuminated light by the semiconductor.

Due to the PEC etching process being driven by the availability of photo-generated electron-hole pairs, light illumination can be used to selectively etch the defective quantum confined nanostructure 350 over the non-defective quantum confined nanostructure 250.

Figure 3D:
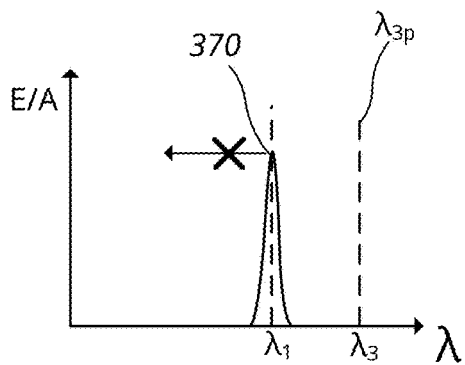
FIGS. 3D-3E show evolutions of the emission/absorption spectra of defective and non-defective quantum confined nanostructures during a defect-selective etching process.
Figure 3E:
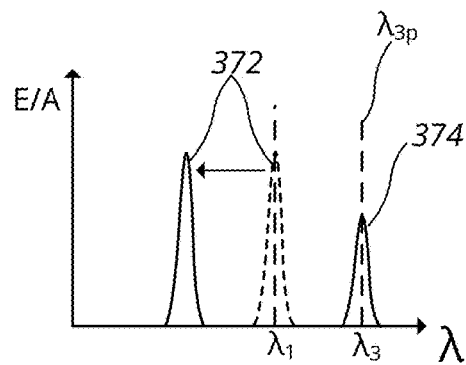

Referring to FIGS. 3D and 3E, evolutions of the emission/absorption spectra of defective and non-defective quantum confined nanostructures during the defect-selective etching process are shown. The quantum confined nanostructures 250 has a first emission/absorption spectrum 370. The defective quantum confined nanostructures 350 has a second emission/absorption spectrum 372, and a defect absorption spectrum 374.

At the beginning of the PEC etching process, the two nanostructures 250 and 350 have identical initial dimension of $d_1$. As such, the first and second absorption spectra 370 and 372 are initially centered on the first wavelength $\lambda 1$ that corresponds to the dimension $d_1$. However, due to the presence of the defect 352, the defective quantum confined nanostructure 350 also has the defect absorption spectrum 374 centered on a third wavelength $\lambda 3$ that is longer than the first wavelength $\lambda 1$. To begin the etching process, the illumination source 320 is turned on to emit the light 330 and controlled such that the third illumination wavelength $\lambda 3p$ of the light 330 overlaps with the defect absorption spectrum 374 without overlapping with the absorption spectrum 370 and 372. For example, the light 330 may be a laser light at the third wavelength $\lambda 3$.

Referring first to FIG. 3D, the light 330 at the third illumination wavelength $\lambda 3p$ does not overlap with the absorption spectrum 370, and the light is not absorbed by the quantum confined nanostructure 250. As the light 330 is not absorbed, photo-generated carriers are not generated, and the non-defective nanostructure 250 is not etched by the PEC etching process. As such, the absorption spectrum 370 remains unchanged, as indicated by the crossed out arrow.

Now referring to FIG. 3E, the light 330 at the third illumination wavelength $\lambda 3p$ overlaps with the defect absorption spectrum 374, and the light is absorbed by the defective quantum confined nanostructure 350. Absorption of the light 330 leads to generation of photo-generated carriers, and the defective nanostructure 350 is etched by the PEC etching process. As such, the second absorption spectrum 372 shifts to the left in the direction of shorter wavelengths.

PEC etching of the defective quantum confined nanostructure 350 generally leads to an increase in the bandgap energy of the nanostructure 350. As such, as the defective nanostructure 350 is etched, combined energy of two photons 332 of the light 330 may no longer be sufficient to overcome the increased bandgap energy. For example, in case when the illumination wavelength $\lambda 3p$ of the light 330 is set to be just outside of the right tail of the absorption spectrum 370 (e.g., $\lambda 1+1$ nm, $\lambda 1+2$ nm, $\lambda 1+5$ nm, or $\lambda 1+10$ nm), the defective nanostructure 350 may be selectively etched until the bandgap energy increases to be greater than twice of the photon energy of the light 330. As a result, the defective nanostructure 350 may be etched down to a dimension that is slightly larger than $0.5*d_1$. At this point, the absorption/emission spectra of the nanostructures 250 and 350 may be sufficiently different such that when both nanostructures are incorporated into an optical device, the defective nanostructure 350 does not contribute to the operation of the device.

While an asymptotic case where the non-defective quantum confined nanostructure 250 is not etched at all while the defective quantum confined nanostructure 350 is etched, in general, the PEC etching process can have a first etch rate for the non-defective quantum confined nanostructure 250 while having a second etch rate greater than the first etch rate for the defective quantum confined nanostructure 350. For example, the second etch rate can be 5 nm/min or less, 4 nm/min or less, 2 nm/min or less, 1 nm/min or less, 0.5 nm/min or less, such as about 0.1 nm/min. In general, the first etch rate and the second etch rate are not fixed rates, but can be ranges of etch rates. As the etch rate of the PEC etching process is affected by the amount of photo-generated carriers, which is in turn related to the amount of absorbed light, the etch rates can change as the dimensions of the defective quantum confined nanostructure 350 change during the PEC etching process.

While sub-bandgap absorption of light assisted by a single defect state has been described, in general, the sub-bandgap absorption of light may be assisted by two or more defect states located between the conduction band and the valence band. For example, the defect 352 may form two defect state energy levels located at approximately one third and two thirds of the bandgap energy above the valence band, and the electron 360 may rise to the conduction band through absorption of three photons 332.

The control over PEC etching of the defective quantum confined nanostructures 350 can be further improved by measuring a flow of current between the defective quantum confined nanostructures 350 and the etchant 310. In some implementations, the voltage source 304 can be a sourcemeter capable of simultaneously outputting a voltage and measuring a current. Alternatively, an ammeter can be placed in series with the voltage source 304 to measure the current. As PEC etching is an electrochemical reaction that involves oxidation and/or reduction of the semiconductor material being etched, the current flow between the defective quantum confined nanostructures 350 and the etchant 310 corresponds to the etch rate of the defective quantum confined nanostructures 350. Furthermore, the total amount of charge flow between the defective quantum confined nanostructures 350 and the etchant 310, which can be determined by integrating the current flow over the etching duration, corresponds to the total amount of material etched. In some implementations, the voltage source 304 can be a pulsed voltage source capable of outputting voltages pulses. Pulsing of voltage may be used to modify characteristics of the PEC etching process.

As the measured current flow indicates the etch rate of the defective quantum confined nanostructures 350, the current flow can be used to determine appropriate illumination wavelength $\lambda 3p$ of the light 330 to be used. For example, a tunable laser source 320 may be controlled to sweep the wavelength of the light 330 in the direction from long wavelength to short wavelength, stopping before known center wavelength $\lambda 1$ that corresponds to the size of the nanostructures 250 and 350. When the current flow rises above a quiescent current level (e.g., 1 nA, 10 nA, 100 nA, or 1 uA), the wavelength may correspond to the energy level of the defect state, and the defective nanostructure 350 may be selectively etched.

Additionally, or alternatively, photoluminescence from the quantum confined nanostructures under illumination can be used to determine the illumination wavelength $\lambda 3p$ of the light 330. For example, when the quantum confined nanostructures 250 and 350 absorb light above the bandgap energy, the quantum confined nanostructures may emit light in response as photoluminescence. This wavelength of photoluminescence, for example, can be used to determine the center wavelength $\lambda 1$ of the spectra 370 and 372, which can be used to set the illumination wavelength $\lambda 3p$ of the light 330 (e.g., longer than $\lambda 1$).

The illumination source 320 can be, for example, fixed-wavelength laser sources, tunable laser sources, and pulsed laser sources. The narrow linewidth (e.g., 0.1 nm or 1 nm) of the light generated by such laser sources may be advantageous in accurately controlling the etching of the defective nanostructure 350 while not etching the non-defective nanostructure 250.

In some cases, it may be necessary to tune the illumination wavelength $\lambda 3p$ of the light 330 during the PEC etching process. For example, the energy level of the defect state may change as the defective nanostructure 350 is etched, which may cause a shift in the center wavelength of the defect absorption spectrum 374 (e.g., shift toward shorter wavelengths). As such, the wavelength of the light 330 may be tuned to follow the shifting defect absorption spectrum 374. Alternatively, a broadband light having wavelengths spanning from just outside of the right tail of the absorption spectrum 370 to $\lambda 3$ and beyond may be used. Such broadband illumination may eliminate a need to tune the wavelength of the light 330.

The etchant 310 can include various chemistries suitable for etching of various semiconductors. Furthermore, the various chemistries can be mixed in various proportions to achieve desired etching characteristics. For example, for PEC etching of GaAs, a mixture of $H_2SO_4$, $H_2O_2$, and $H_2O$ may be used in ratio of 1:1:25-100, respectively. As another example, for PEC etching of AlGaAs, a mixture of HCL and $H_2O$ may be used in ratio of 1:20, respectively. As yet another example, for PEC etching of InGaN and GaN, a 0.2M solution of $H_2SO_4$ may be used. As yet another example, for PEC etching of AlGaInN, oxalic acid ($C_2H_2O_4$) may be used. Other examples of chemistries include 4.5-dihydroxy-1.3-benzene disulfonic acid, hydro fluoric acid, tetrabutylammonium fluoroborate ($TBABF_4$), KOH, $H_3PO_4$, and $NaH_2PO_4$.

The counter electrode 306 can be formed from various conductive material compatible with the chemistry of the etchant 310. Examples of materials for the counter electrode 306 include platinum and gold. Additionally, in some implementations, a reference electrode can be used to provide a reference potential that can be used in accurately applying the voltage across the quantum confined nanostructures and the etchant 310. Examples of the reference electrode include silver/silver chloride electrode and saturated calomel electrode.

While a voltage has been applied across the etchant 310 and the quantum confined nanostructures in the described example, in some implementations, PEC etching can be performed without applying an external voltage. Such PEC etching process are referred to as "electroless process." In an electroless PEC etching process, the application of voltage across the etchant 310 and the quantum confined nanostructures may be replaced with an oxidizing agent dissolved in the etchant 310.

While PEC etching of the quantum confined nanostructures using a liquid etchant 310 has been described, PEC etching may also be performed with gas-phase etchants in an analogous manner. Examples of chemistries for gas-phase etchant include various mixtures of $Cl_2$, $BCl_3$, $SF_6$, $CF_4$, $CH_4$, $CHF_3$, $O_2$, $H_2$, $N_2$, Ar, and He.

Use of gas-phase PEC etching can enable deposition of the quantum confined nanostructures followed by PEC etching of the quantum confined nanostructures without the substrate leaving the vacuum environment. For example, both the deposition and PEC etching of the quantum confined nanostructures can be performed in a single vacuum chamber. Alternatively, the deposition and etching can each be performed on dedicated deposition and etching chambers connected by a transfer chamber that enable transfer of the substrate without leaving vacuum. The gas-phase PEC etching of different regions of the substrate can be performed without masking layers by using patterned illumination. Processing of the quantum confined nanostructures from deposition through PEC etching through epitaxial regrowth without the quantum confined nanostructures being exposed to atmosphere may improve performance of the quantum confined nanostructures.

So far, use of illumination to control the growth and etching of quantum confined nanostructures has been described. Quantum confined nanostructures are typically grown in a vacuum chamber. Vacuum chambers are typically formed from metals such as stainless steel, which typically reflect light. Reflection of light by the substrate and by walls of the vacuum chamber may lead to an unwanted non-uniformity in the intensity of light on the substrate. As such, various techniques for reducing unwanted reflection within a vacuum chamber will now be described.

Figure 4A:
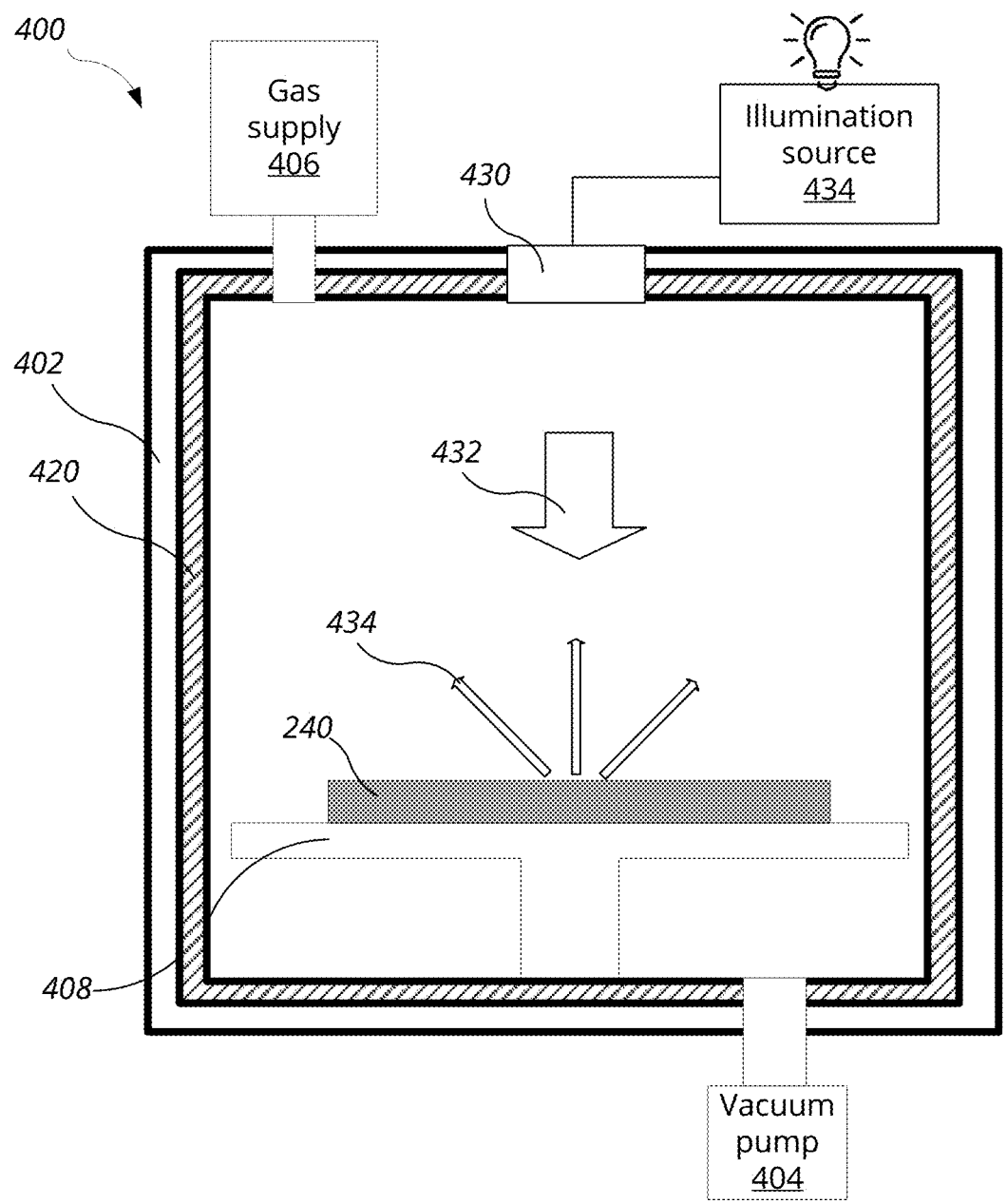
FIG. 4A shows an example vacuum system.

Referring to FIG. 4A, a vacuum system 400 is shown. The vacuum system 400 includes a chamber 402, a vacuum pump 404, a gas supply 406, a chuck 408, a chamber liner 420, and an optical pass-through 430. The chuck 408 supports the substrate 240. The vacuum pump 404 generates a vacuum environment for growth of quantum confined nanostructures. The gas supply 406 provides gases necessary for growth of quantum confined nanostructures. The optical pass-through provides an opening on the chamber 402 for introducing light 432 generated by the illumination source 434 into the chamber 402. The illumination source 434 may be similar to the illumination sources 220 and 320.

The light 432 illuminates the substrate 240 placed on the chuck 408. The substrate 240 typically reflects a portion of the incident light 432 as reflected light 434. For example, the reflection may be due to an index mismatch at the interface between the vacuum environment and the substrate 240, i.e., Fresnel reflection. The reflected light 434 travels toward the inner walls of the chamber 402, which are typically metallic and reflective. As such, the reflected light 434 may be reflected by the reflective walls of the chamber 402, and a portion of the reflected light 434 may be redirected to the substrate 240. The additional illumination of the substrate 240 by the reflected light 434 may cause non-uniformity in the intensity of the light on the substrate. Such non-uniformity may be more pronounced when the reflections from the substrate 240 and the walls of the chamber 402 are specular. Further, when the light 432 is a coherent light (e.g., laser), the interference between the light 432 and the reflected light 434 at the surface of the substrate 240 may further enhance the non-uniformity in intensity.

The chamber liner 420 may be arranged along the inner walls of the chamber 402 to reduce or eliminate reflection of the reflected light 434 by the chamber walls. For example, the chamber liner 420 may be formed from a broadband absorber that absorbs light across a range of wavelengths including the wavelength of the reflected light 434. Examples of broadband absorbers include amorphous graphite, silicon carbide, and black semiconductor materials such as black silicon. Black semiconductor materials have a textured surface which may reduce Fresnel reflection at the optical interface and increases absorption of incident light. Such broadband absorber may absorb substantially all of the incident light (e.g., greater than 90%, 95%, 99%, or 99.9%), resulting in reflection of substantially no light (e.g., less than 10%, 5%, 1%, or 0.1%).

As another example, the chamber liner 420 may be formed from a stack of thin films configured to absorb light at the wavelength of the reflected light 432. For example, an optically thick base layer of optically absorbing material, such as amorphous silicon, followed by a antireflection coating tuned to the wavelength of the reflected light 432 may absorb substantially all of the incident light (e.g., greater than 90%, 95%, 99%, or 99.9%), resulting in reflection of substantially no light (e.g., less than 10%, 5%, 1%, or 0.1%). An optically thick base layer has a thickness that results in absorption of substantially all of the incident light. For example, a 10 µm to 100 µm layer of silicon or silicon carbide may be considered to be optically thick in the visible and near infrared wavelengths.

In some cases, the light 432 may also illuminate the chuck 408 that supports the substrate 240. The chuck 408 may be formed from various materials such as graphite, molybdenum, or copper, and is typically at least partly reflective. As such, a layer similar to the chamber liner 420 may be arranged on the surface of the chuck 408 to reduce reflection. Additionally, or alternatively, the surface of the chuck 408 may be roughened to reduce specular reflection from the chuck 408.

Figure 4B:
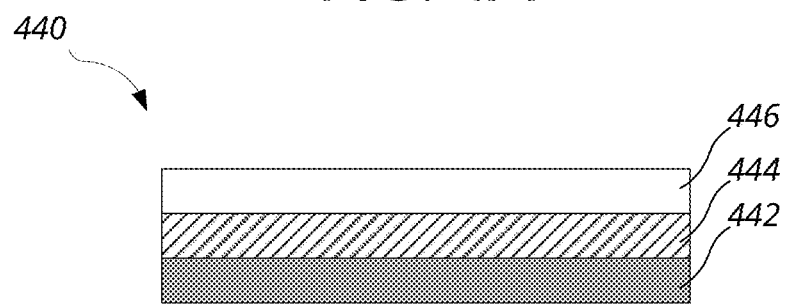
FIG. 4B shows an example anti-reflective substrate.

Another way of reducing the amount of reflected light 434 incident of the substrate 240 is to reduce the reflectivity of the substrate 240 to reduce or eliminate the reflection of the light 432. Referring to FIG. 4B, an example of an anti-reflective substrate 440 is shown. The anti-reflective substrate 440 includes a crystalline substrate 442, an absorber layer 444, and a transition layer 446.

The crystalline substrate 442 may be similar to the substrate 240. When light 432 illuminates a substrate, such as the substrate 240, the light-facing surface (e.g., a first surface opposite from a second surface in contact with the chuck 408) of the substrate typically reflects at least a portion of the light 432 due to an index mismatch at the interface between the vacuum environment and the substrate. In some cases, the substrate may be optically transparent or weakly absorbing at the illumination wavelength of the light 432. In such cases, a portion of the light that is not reflected by the light-facing surface may propagate through the substrate, which may then be reflected by the chuck 408 or the chuck-facing surface of the substrate and escape from the light-facing surface, further increasing the magnitude of the reflected light 434. Such multi-pass reflection may be reduced or eliminated by arranging the absorber layer 444 over the light-facing surface (e.g., top surface) of the substrate 442. The absorber layer 444 is strongly absorbing at the wavelength of the light 432, such that the light may be substantially absorbed (e.g., greater than 90%, 95%, 99%, or 99.9%) in a single pass or a double pass (i.e., roundtrip) through the absorber layer 444. The absorber layer 444 may be formed from various semiconductor materials, for example.

In some implementations, the absorber layer may be a compound semiconductor with similar constituent elements as the semiconductor material that is being deposited by the system 400 to form the quantum confined nanostructures. For compound semiconductors, the bandgap, and hence the absorption wavelengths, of the material varies as a function of the fractional elemental composition. For example, for $In_xGa_{1-x}N$ material, the bandgap may vary from that of InN (approximately 0.69 eV) for x=1, to that of GaN (approximately 3.4 eV) for x=0. As such, when the quantum confined nanostructure being formed is formed from a composition having a low x value (e.g., x=0.2), the absorber layer 444 may be formed from a composition having an x value higher than the material being deposited (e.g., x=0.5) such that the bandgap of the absorber layer 444 is smaller than that of the material being deposited, and hence strongly absorb the incident light 432 that has not been absorbed by the deposited material.

The absorber layer 444, however, may still reflect a portion of the light 432 at the interface between the vacuum environment and the absorber layer 444 due to an index mismatch. Such reflection may be reduced or eliminated by arranging the buffer layer 446 over the light-facing surface (e.g., top surface) of the absorber layer 444. The transition layer 446 is a layer configured to reduce or eliminate the reflection between the vacuum environment and an underlying layer, such as the absorber layer 444. For example, the transition layer 446 may be an anti-reflective coating layer configured to reduce or eliminate reflection at the illumination wavelength of the light 432. An anti-reflecting coating layer may be implemented using standard thin-film interference techniques, and may include one or more alternating layers of different refractive indices.

As another example, the transition layer 446 may be a graded-composition material in which the composition of the material, and hence the refractive index, varies along the direction normal to the surface of the substrate 442. By varying the refractive index from a first value that is closer to the index of the vacuum environment (e.g., less than 1.3, 1.4, 1.5, 1.7, or 2.0) at the light-facing surface to a second value that is closer to the index of the absorber layer 444 (e.g., greater than 1.3, 1.4, 1.5, 1.7, or 2.0), reflection due to index mismatch at the interfaces may be reduced. Furthermore, the graded-composition material may provide lattice matching between the underlying absorber 444 and the semiconductor material being deposited for forming quantum confined nanostructures. For example, for an absorber layer 444 formed from $In_xGa_{1-x}N$ with x=0.5 in the earlier example, the composition of the transition layer 446 may be graded from x=0.5 to x=0.2 to provide both lattice matching and index matching between the absorber layer 444 and the quantum confined nanostructure being formed. In some implementations, the transition layer 446 may be formed from a quaternary semiconductor material. In some implementations, the transition layer 446 may include both the graded composition-material and the anti-reflective coating.

So far, various techniques for growth and control of quantum confined nanostructures have been described. Growth of quantum confined nanostructures on conventional substrates typically leads to a random distribution of quantum confined nanostructures over the surface of the substrate exposed to the growth environment, such as the quantum confined nanostructure forming environment 210. In some cases, however, confining the growth of the quantum confined nanostructure to certain locations of the substrate may be desired. As such, a substrate with discrete growth sites for controlling the growth location of the quantum confined nanostructure will now be described.

Figure 5A:
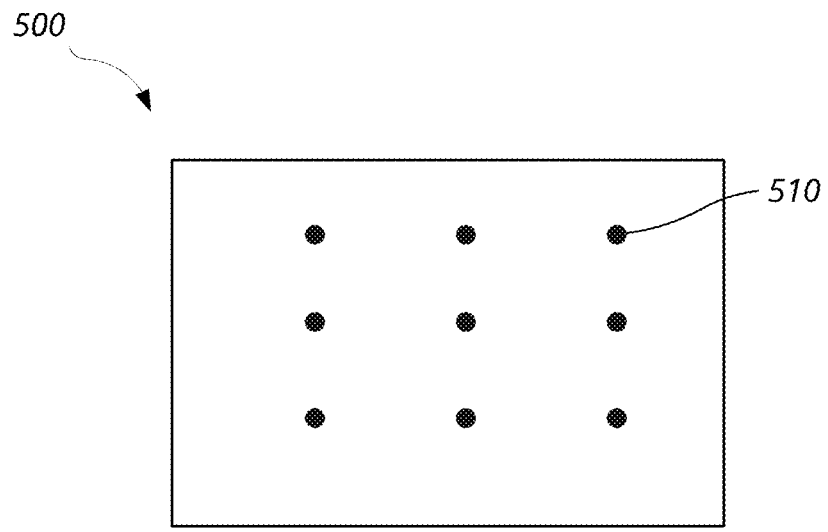
FIGS. 5A-5B show top and cross-sectional views of an example substrate having discrete growth sites.
Figure 5B:
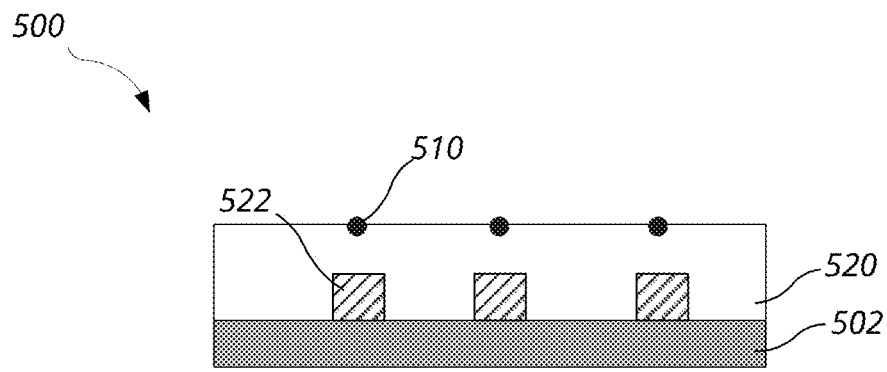

Referring to FIGS. 5A and 5B, top and cross-sectional views of an example substrate 500 having discrete growth sites are shown. The substrate 500 includes a substrate 502, growth sites 510 and a strain-generation layer 520. The strain-generation layer includes strain generators 522. The substrate 502 may be similar to the substrate 240.

Due to the dynamics of the process by which quantum confined nanostructures are formed on the substrate by the forming environment, points of high strain relative to surrounding areas of the substrate surface may experience higher rate of material growth relative to the surrounding areas. For example, the deposited material may accumulate such that the potential energy of the deposited material is minimized. If the substrate has strain variations, such as from having larger lattice constants in some regions and smaller lattice constants in others regions, the binding energy of the material being deposited may be affected by the strain, which may affect the rate at which the materials are deposited in different regions of the substrate. As another example, lateral compressive strain may contribute to transport of material being deposited on the substrate surface toward points of high strain. As such, points of high strain along the surface of the substrate 500 may act as growth sites 510 that lead to controlled growth of the quantum confined nanostructures at those growth sites 510.

Strain is typically generated by a presence of spatial non-uniformity in mechanical characteristics of an underlying layer. One way of generating such a spatial non-uniformity is by forming regions of a first material embedded within a layer of a second material different from the first material. Referring to FIG. 5B, the strain generator 522 is embedded within the strain-generation layer 520, and forms growth sites 510 that are vertically aligned to the locations of the strain generators 522.

The strain generator 522 may be formed in various ways. For example, in some implementations, a uniform layer of buffer material may be initially deposited on the substrate 502. The buffer material may be an epitaxially-grown graded-composition material for lattice matching of the quantum confined nanostructure to the underlying substrate 502. Then trenches that define the contours of the strain generators 522 may be etched into the layer of deposited buffer material. A blanket layer of strain-generating material may then be deposited over the buffer material and the trenches, filling the trenches with the strain-generating material. In general, strain-generating material is a material with mechanical characteristics different from that of the buffer material, such as a material with a lattice constant different from that of the buffer material. Examples of the strain generating material include compound semiconductors with composition that is different from the buffer material. A difference in the compositions typically leads to a difference in the lattice constants.

At this point, the layer of strain-generating material deposited over the trenches follow the topology of the underlying trenches, and hence does not have a planar surface. A planarization step, such as a chemical-mechanical polishing (CMP) step, may be performed to remove some or all of the strain-generating material deposited outside of the trench, and form a planarized surface. Additional buffer material may then be deposited over the planarized surface to form a planar surface having a uniform material composition for deposition of semiconductor material for forming quantum confined nanostructures. As a result, growth sites 510 that are vertically aligned to the locations of the trenches filled with strain-generating material are formed on the surface of the buffer material.

As another example process for fabricating the substrate 500, in some implementations, the substrate 502 may be patterned and etched to leave posts of substrate material that correspond to the strain generators 522 on the surface of the substrate 502. A blanket layer of buffer material may then be deposited on the substrate 502. A planarization step, such as a chemical-mechanical polishing (CMP) step, may then be performed to remove surface topologies at locations that correspond to the strain generator posts 522. As a result, growth sites 510 that are vertically aligned to the locations of the strain generator posts 522 are formed on the surface of the buffer material.

The substrate 500 with growth sites 510 may be used to grow quantum confined nanostructures at the growth sites 510. By limiting the growth of quantum confined nanostructures to the growth sites 510, the quantity and the locations of the quantum confined nanostructure may be controlled, which may be beneficial in various applications of the quantum confined nanostructures. For example, in quantum computing applications, few tens of qubit may be implemented by growing few tens of quantum confined nanostructures at controlled locations. As the quantum confined nanostructures are aligned to the growth sites 510, additional processing steps may be performed in alignment to the growth sites 510 to form, for example, interconnects that couple the qubits together, resulting in a quantum computing circuit.

A number of embodiments have been described. Nevertheless, it will be understood that various modifications may be made without departing from the spirit and scope of the invention. Accordingly, other embodiments are within the scope of the claims.

What is claimed is:

1. A method, comprising:
    providing a substrate comprising a layer of a crystalline material having a first surface; and
    exposing the first surface to an environment under conditions sufficient to cause epitaxial growth of a layer of a deposition material on the first surface, wherein exposing the first surface to the environment comprises illuminating the substrate with light at a first wavelength while causing the epitaxial growth of the layer of the deposition material,
    wherein the first surface comprises one or more discrete growth sites at which an epitaxial growth rate of the quantum confined nanostructure material is larger than areas of the first surface away from the growth sites by an amount sufficient so that the deposition material forms a quantum confined nanostructure at each of the one or more discrete growth sites.

2. The method of claim 1, wherein an epitaxial growth rate of the deposition material decreases when the discrete quantum confined nanostructure exceeds a dimension corresponding to the first wavelength.

3. The method of claim 2, wherein the light at the first wavelength is linearly polarized along a first direction.

4. The method of claim 3, wherein exposing the first surface to the environment further comprises illuminating the substrate with light at a second wavelength while causing the epitaxial growth of the layer of the deposition material.

5. The method of claim 4, wherein the light at the second wavelength is linearly polarized along a second direction orthogonal to the first direction.

6. The method of claim 5, wherein the substrate is exposed to the light at the first and second wavelengths simultaneously.

7. The method of claim 5, wherein the one or more quantum confined nanostructures have an anisotropic shape having a long dimension and a short dimension orthogonal to the long dimension, the long and short dimensions corresponding to the first and second wavelengths, respectively.

8. The method of claim 2, wherein the substrate comprises a layer that substantially absorbs light at the first wavelength.

9. The method of claim 2, wherein the environment is provided by a deposition chamber in which the substrate is placed, an inner wall of the deposition chamber reflecting substantially no light at the first wavelength.

10. The method of claim 1, wherein the one or more discrete growth sites correspond to locations of increased strain in the crystalline material relative to strain in the crystalline material away from the growth sites.

11. The method of claim 10, wherein the substrate comprises a second layer adjacent to the layer of the crystalline material, the crystalline layer being an epitaxial layer and second layer comprising portions having a first composition and portions having a second composition different from the first composition, the variation in composition of the second layer causing the locations of increased strain in the crystalline material.

12. The method of claim 1, wherein the epitaxial growth is performed using chemical vapor deposition.

13. The method of claim 1, wherein the epitaxial growth is performed using molecular beam epitaxy.

14. The method of claim 1, further comprising exposing the deposition material to an etchant to remove deposition material from the substrate.

15. The method of claim 14, further comprising exposing the deposition material to illumination at a third wavelength simultaneously to exposing the deposition material to the etchant.

16. The method of claim 15, wherein the light at the third wavelength increases removal of the deposition material at growth site where the deposition material comprises a defect relative to the deposition material at a growth site where the deposition material is free from defects.

17. The method of claim 16, wherein the defect causes absorption of two more photons at the third wavelength by the deposition material.

* * * * *